United States Patent

Hahn

[11] Patent Number: 4,520,277
[45] Date of Patent: May 28, 1985

[54] HIGH GAIN THYRISTOR SWITCHING CIRCUIT

[75] Inventor: Larry A. Hahn, Richardson, Tex.

[73] Assignee: Texas Instruments Incorporated, Dallas, Tex.

[21] Appl. No.: 376,461

[22] Filed: May 10, 1982

[51] Int. Cl.³ .............................................. H03K 17/73
[52] U.S. Cl. ............................. 307/252 C; 307/252 F; 307/252 J; 307/305; 357/38
[58] Field of Search .......... 307/252 C, 252 D, 252 F, 307/252 J, 252 M, 305; 357/38

[56] References Cited

U.S. PATENT DOCUMENTS

| | | | |
|---|---|---|---|
| 3,189,783 | 6/1965 | Van Berkum | 307/252 D |
| 3,263,128 | 7/1966 | White | 307/252 C |
| 3,821,565 | 6/1974 | Horinaga | 307/252 C |
| 4,117,350 | 9/1978 | Kalfus et al. | 307/252 C |
| 4,359,655 | 11/1982 | Fukui | 307/252 F |

*Primary Examiner*—John Zazworsky
*Attorney, Agent, or Firm*—Richard A. Bachand; N. Rhys Merrett; Melvin Sharp

[57] ABSTRACT

A three terminal power switch utilizing a lateral thyristor switching circuit is disclosed which exhibits very high gain for both turn-on and turn-off. The gate turn-off capability of the lateral thyristor is accomplished utilizing a secondary shunting thyristor to pull current out of the gate in response to the turn-off signal. The output thyristor is designed to maximize its turn-off gain, and the drive thyristor is designed for optimum forward conduction characteristics; the output thyristor carries approximately ten times the current of the drive thyristor, in one embodiment.

3 Claims, 2 Drawing Figures

HIGH GAIN THYRISTOR SWITCHING CIRCUIT

BACKGROUND OF THE INVENTION

Thyristor switching has been accomplished wherein the three terminal device, anode, cathode, and gate are integrated in a conventional junction isolated technology. Problems have been experienced with turn-off amplification since a conducting thyristor may not allow control of the anode current from the gate electrode.

Accordingly, an object of the present invention is to provide a switching circuit having the capability of high gain in both turn-off and turn-on.

Another object of the present invention is to provide a thyristor switching circuit having a turn-on and turn-off current gain in excess of 500.

A further object of the present invention is to provide a thyristor switching circuit capable of being integrated on a chip in conjunction with standard bipolar devices.

SUMMARY AND BRIEF DESCRIPTION OF THE INVENTION

Briefly and in accordance with the present invention, a switching circuit is provided having essentially similar current gain for both turn-on and turn-off amplification comprising a first thyristor and a second thyristor wherein the anode terminal of the second thyristor is connected to the gate terminal of the first thyristor. This connection allows the second thyristor to turn off the first load thyristor quickly.

In one embodiment, the circuit as above further comprises a load diode in series with the first thyristor, the load diode connected between the cathode connection of the first thyristor and the lower potential output terminal of the switch circuit. This diode shifts the potential level of the load thyristor such that the cathode of the turn-off or second thyristor can be connected directly to the same output terminal of the switch circuit.

In another embodiment, the circuit as above further comprises at least one diode connected in series between the input terminal of the switch circuit and the gate terminal of the first thyristor. This diode routes current through the gate of the second thyristor when the input is low, the second thyristor is also connected to the gate terminal of the first thyristor, such that the current is appropriately drawn from the gate of the load thyristor through the anode of the second thyristor in a turn-off condition.

A circuit as described above is provided wherein the turn-off gain of the first thyristor is approximated by a whole number and the current carrying capacity of the second thyristor is expressed approximately as the inverse of that number multiplied by the current carrying capacity of the first thyristor.

A circuit in accordance with the present invention comprises means for inputting a switch signal; a first resistor means in series with the input means, for controlling the input switch signal; at least one diode means in series with the first resistor means, for controlling the voltage level at the output of the diode means; a second resistor means connected to the output of the diode means, said second resistor means for shunting the current to ground for controlling the potential with the respect to the input signal at the input means, said second resistor means being further connected to the lower potential output of the circuit; and at least one thyristor having its gate terminal connected to the at least one diode means and also connected to the second resistor means, the thyristor for conducting load current.

Furthermore, one variation of the above circuit further comprises a second thyristor means for conducting current from the gate of the first thyristor means, said second thyristor amplifying turn-off of said first thyristor.

An integrated circuit means for switching in accordance with the present invention comprises a substrate of a first conductivity type; a doping impurity diffusion in one surface of said substrate, the impurity of the opposite conductivity type; an epitaxial layer of said opposite conductivity type on the surface of the substrate and overlying the opposite conductivity diffused areas; doped areas of the first conductivity type forming isolated cells in the epitaxial layer of the opposite conductivity type and capable of electrically isolating the epitaxial areas of the opposite conductivity type one from the other; one of the isolated epitaxial areas further doped with impurities of the first conductivity type in two regions, furthermore having additional impurities of the opposite conductivity type doped wholly within the first conductivity type doped regions such that the opposite conductivity type impurities are completely surrounded with respect to electrical contact with said one epitaxial area by the first conductivity type impurities; a second isolated epitaxial cell area essentially similar to that of the first isolated area further having a second doped region with impurities of the opposite impurity type; and a third isolated epitaxial cell area having two doped regions of said opposite conductivity type wherein one of the two regions is completely surrounded with respect to electrical contact with the epitaxial cell area by a single doped region of the first type, and common electrical contact is made to the non-isolated region of opposite conductivity and to the surrounding region of first conductivity type.

An integrated circuit essentially is described above wherein the first isolated epitaxial cell area comprises an output thyristor, the second isolated epitaxial cell area comprises a drive thyristor, and the third isolated epitaxial cell area comprises a load diode.

Additionally, the integrated circuit as described may further include logic circuitry in conjunction with the power switch circuit.

Referring now to the drawings.

DETAILED DESCRIPTION OF THE DRAWINGS

Figure 1:
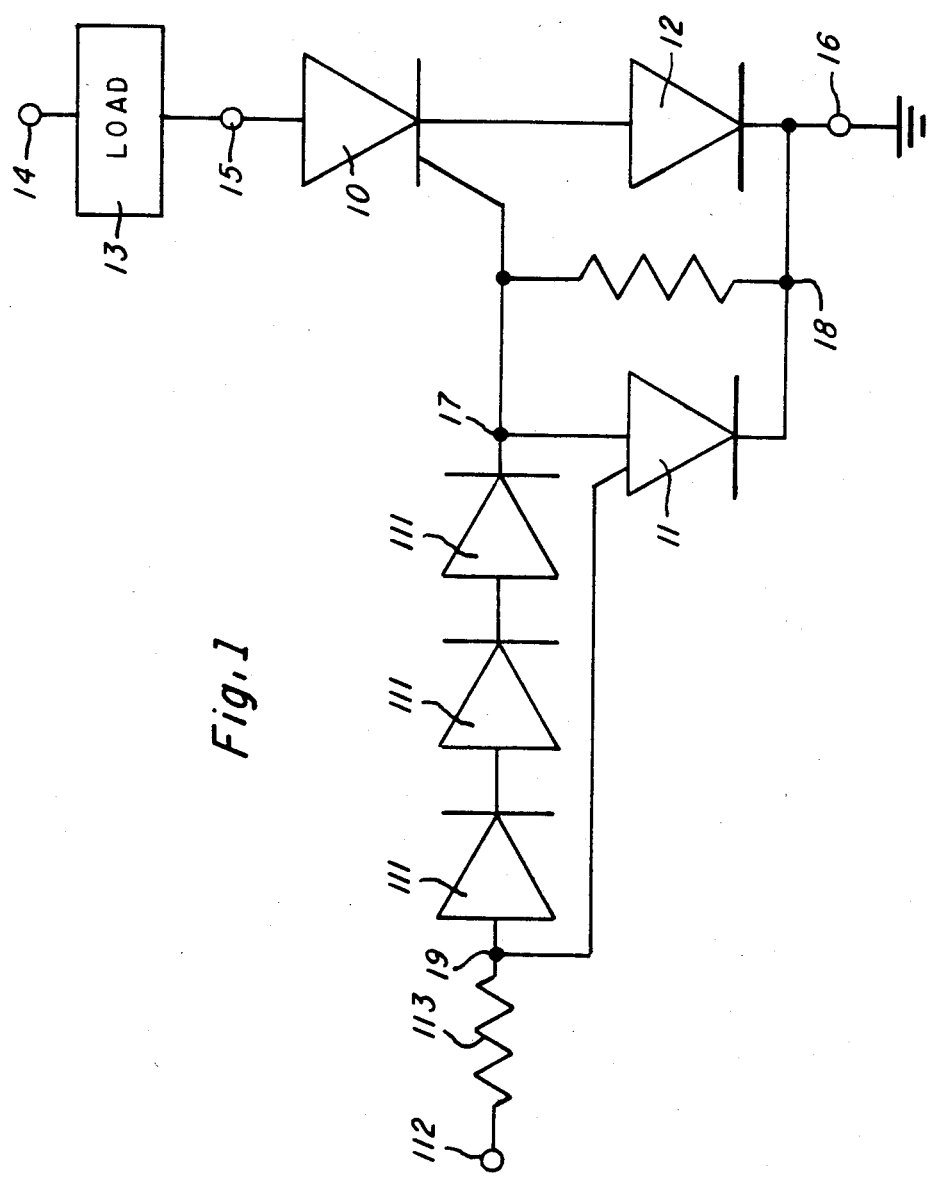
FIG. 1 is a schematic circuit representation of one embodiment of the present invention.

Referring now to FIG. 1, the schematic circuit representation of one embodiment of the present invention is shown in a three-terminal power switch configuration. Input gate terminal 112 is shown as are the output terminals 15 and 16 wherein terminal 15 is the higher potential node and 16 is the lower potential output node.

Load 13 is shown connected between the power supply terminal 14 in the present embodiment. Alternative embodiments have load 13 connected at node 16 before the connection is made to ground. Resistor 113 enables an input signal to be translated into a voltage differential at node 19, thus triggering thyristor 11 into turn-on dependent upon the potential developed between node 19 and node 17 across diodes 111. The diodes 111 enable a low input signal at 19 to turn-on thyristor 11 rapidly. When thyristor 11 turns on, node 17 at a higher potential level, provides a current path through thyristor 11 for current from gate connection of thyristor 10, this results in the following sequence: assuming thyristor 10 is in the conducting state conducting from node 15 through diode 12 to terminal 16, a low signal at gate node 112 will provide sufficient potential across thyristor 11 to cause turn-on and thus draw current from node 17 to the output terminal 16. This will cause a rapid turn-off of thyristor 10 and thus shut down current through load 13.

The turn-on sequence operates in a manner as follows. A high signal at input node 112 provides a higher potential at node 19 and at node 17 through diodes 111 resulting in sufficient turn-on potential to thyristor 10 to cause that thyristor to turn on rapidly. Thyristor 10 is designed for rapid and amplified turn on. Additionally, diodes 111 maintain node 19 at a higher potential than node 17, such that thyristor 11 is held in the off state. Diode 12 is provided to compensate for the p n voltage barrier differential necessary for thyristor 11 to be between the gate of thyristor 10 and the output terminal 16. Additionally, diode 12 must be designed to be capable of conducting the same current as thyristor 10 since they are connected in series.

It can be seen from the foregoing description that the current through thyristor 10 is substantially load current for the device and, thus, thyristor 10 must be designed for rapid turn-on as well as high current carrying capacity. Conversely, thyristor 11 as the drive thyristor must be capable of a rapid turn-on sufficient to draw current from the gate of thyristor 10 and, thus, it too must be designed for rapid turn-on. However, its current carrying capacity is less than that of thyristor 10 since the majority of the load current does not go through thyristor 11.

The preferred current carrying capacity of thyristor 11 is given by the following formula: the turn off gain of thyristor 10 divided into the current carrying capacity of thyristor 10 is substantially approximated by the current carrying capability of thyristor 11. Within these parameters, the three-terminal device can provide a turn-on and turn-off gain within the required parameters normally 500 or more, and all the devices described are capable of being integrated on a single substrate.

Figure 2:
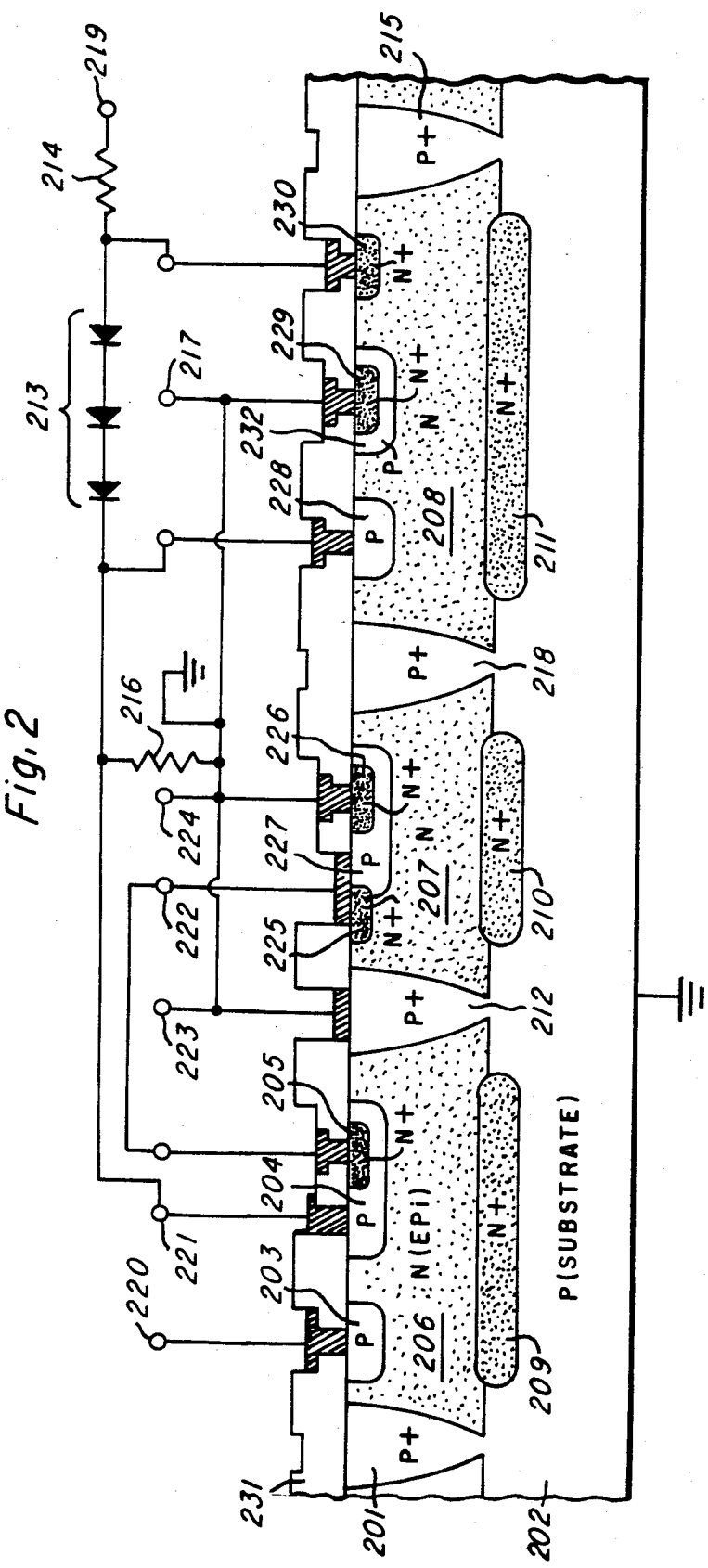
FIG. 2 is a schematic circuit representation in conjunction with a cross-sectional view of an integrated circuit substrate showing how one embodiment of the invention is built.

Referring now to FIG. 2, a schematic diagram in conjunction with a cross-sectional view of one embodiment of the invention is shown in which substrate 202 is a p-type substrate having p-type isolation regions 201, 212, 218, and 215 for isolating various active devices on the same substrate. Regions 209, 210, and 211 are n-type diffused areas upon which n-type epitaxial layer 206, 207, and 208 are grown. The input node 219 is shown connected to input resistor 214 as described previously. Voltage potential across diodes 213 is translated into an input signal into the drive thyristor 208 in conjunction with the gate region 230 of n-type diffusion and the anode region 228 of p-type doping. N-type region 229 forms the cathode of the drive thyristor with the connection at 217 being connected essentially at circuit ground. The p-type isolation regions 218, 212, 201, and 215 are also connected substantially at substrate 202 ground. Additionally, this connection is common with node 224 which is the lower potential output for the circuit. The output thyristor defined by the epitaxial area 206 has its anode connection 220 substantially representing the input to the circuit. Thus, connection 220 is the higher potential output contact for connection to either VCC or the load in this circuit. When the circuit is in a conducting state, the current will normally flow from connection 220 through p-type doped area 203 through the n-type epitaxial area 206 to the n-type region 205 which is surrounded electrically by the p-type gate region 204. This region, 204, is the gate for the load or output thyristor and its gate connection 221 is controlled by the input connected at 219. The current flowing from the n-type region 205 then is conducted through node 222 into the output diode and into the n-type region 225 adjacent the p-type region of the diode 227 and, thus, into the lower potential region (negative) 226 and out the lower potential output node 224.

As described, an input signal in excess of four volts at node 219 will turn on the output thyristor defined by the n-type epitaxial region 206 and cause current flow through that thyristor and in series through the diode defined by the n-type epitaxial region 207 and, thus, towards the more negative potential output terminal. When a low input signal, less than 1 volt in the present embodiment, is imposed at node 219, the drive thyristor defined by the epitaxial region 208 turns on and thus draws current away from the gate node 221 causing the output thyristor defined by the region 206 to turn off. Resistor 216 and resistor 214 as well as diodes 213 are all integrated on substrate 202 and are shown in a schematic form for simplicity.

Additional logic circuits may be built on substrate 202 utilizing a p-type substrate and n-type epitaxial layer as are commonly known in the industry.

The design and the physical fundamentals of thyristors are described in detail in an article entitled "Physical Fundamentals and Technical Aspects of the Lateral Thyristor" by Rudolph Aulbach, published in Solid State Electronics, Vol. 22, pgs. 163-175, 1979, which is incorporated herein by reference. That article describes design parameters of the typical thyristor which are applicable to an integrated circuit. Various embodiments of the present invention are possible without departing from the scope and spirit of the appended claims.

What is claimed is:

1. A switch circuit having substantially equal gain for both turn-on and turn-off amplification for completing a current path from a source of power, through a load, to ground, comprising:
   a. a first thyristor, having an anode connected to said load, a cathode, and a gate;
   b. at least one diode connected in series between an input signal terminal and the gate of said first thyristor;
   c. a second thyristor, having an anode connected to the gate terminal of said first thyristor, a cathode connected to ground, and a gate connected to receive an input signal on said input signal terminal; and
   d. a junction diode connected as a load in series between the cathode of said first thyristor and ground to compensate for a voltage differential between the gate of said first thyristor and ground.

2. The switch circuit of claim 1 further comprising a first resistor in series with said input signal terminal and said at least one diode for controlling said input signal, and a second resistor connected between the gate of said first thyristor and ground for controlling the potential on the gate of said first thyristor with respect to the input signal.

3. A circuit as in claim 1 wherein the inverse of the turn-off gain of said first thyristor multiplied by the current carrying capacity of said first thyristor substantially approximates the current carrying capacity of said second thyristor.

* * * * *